United States Patent
Lee et al.

(10) Patent No.: US 6,720,129 B2
(45) Date of Patent: Apr. 13, 2004

(54) MALEIMIDE-PHOTORESIST POLYMERS CONTAINING FLUORINE AND PHOTORESIST COMPOSITIONS COMPRISING THE SAME

(75) Inventors: Geun Su Lee, Ichon-shi (KR); Jae Chang Jung, Ichon-shi (KR); Ki Soo Shin, Seoul (KR)

(73) Assignee: Hynix Semiconductor Inc, Kyoungki-Do (KR)

( * ) Notice: Subject to any disclaimer, the term of this patent is extended or adjusted under 35 U.S.C. 154(b) by 0 days.

(21) Appl. No.: 10/107,659

(22) Filed: Mar. 27, 2002

(65) Prior Publication Data

US 2002/0164541 A1 Nov. 7, 2002

(30) Foreign Application Priority Data

May 4, 2001 (KR) .......................... 2001-24266

(51) Int. Cl.$^7$ .............................. G03P 7/004
(52) U.S. Cl. ................ 430/270.1; 430/326; 430/907; 526/242; 526/281; 526/262; 526/219.6; 526/232.1
(58) Field of Search ............... 430/270.1, 907, 430/326; 528/359.1, 540; 526/219.6, 232.1, 242, 262, 281, 268, 256

(56) References Cited

PUBLICATIONS

Hatakeyama, et al. U.S. publication US 2001/0038969 A1.*

\* cited by examiner

*Primary Examiner*—Rosemary Ashton
(74) *Attorney, Agent, or Firm*—Marshall, Gerstein & Borun LLP

(57) ABSTRACT

Photoresist polymers, and photoresist compositions using the polymer are disclosed. More specifically, photoresist polymers containing maleimide represented by Formula 1. Photoresist compositions including the photoresist polymers have excellent etching resistance, heat resistance and adhesiveness, and development ability in aqueous tetramethylammonium hydroxide (TMAH) solution. As the compositions have low light absorbance at 193 nm and 157 nm wavelength, they are suitable for a process using ultraviolet light source such as VUV (157 nm).

Formula 1

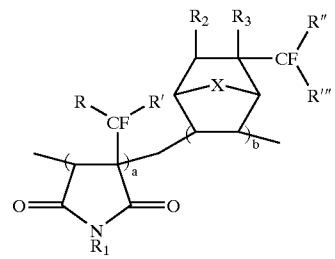

wherein, 1, $R_1$, $R_2$, $R_3$, R, R', R", R''', X, a and b are defined in the specification.

18 Claims, 5 Drawing Sheets

MALEIMIDE-PHOTORESIST POLYMERS CONTAINING FLUORINE AND PHOTORESIST COMPOSITIONS COMPRISING THE SAME

BACKGROUND

1. Technical Field

Novel photoresist polymers and photoresist compositions containing the same are disclosed. In particular, photoresist polymers suitable for a photolithography process using DUV (deep ultraviolet) light source, such as VUV (157 nm) in fabricating minute circuit for highly integrated semiconductor devices, photoresist compositions containing the same, and preparing process therefor are also disclosed.

2. Description of the Related Art

A photoresist for an ArF and VUV (vacuum ultraviolet) should have low absorbency at 193 nm and 157 nm wavelengths, excellent etching resistance and adhesiveness on a substrate, and should be easily developable in a commercially available developing solution, such as aqueous tetramethylammonium hydroxide (TMAH) solution of 2.38 wt % or 2.6 wt %.

Recently, much research has been conducted on resins having a high transparency at 248 nm and 193 nm wavelengths and dry etching resistance similar to novolac resin. However, most of the resists are not suitable for VUV due to their high absorbency at 157 nm wavelength.

Photoresists containing fluorine have also been studied to solve the above problem. However, most polyethylene, polystyrene or polyacrylate polymers containing fluorine have weak etching resistance, low solubility in aqueous TMAH solutions and poor adhesiveness to the silicon wafer. In addition, these photoresists are difficult to mass-produce and are expensive.

SUMMARY OF THE DISCLOSURE

Novel photoresist polymers containing fluorine-substituted maleimide are disclosed.

Photoresist compositions containing the photoresist polymers described above and processes for forming photoresist patterns are also disclosed.

Semiconductor elements produced using the photoresist compositions described above are also disclosed.

DETAILED DESCRIPTION OF THE PRESENTLY PREFERRED EMBODIMENTS

Photoresist polymers of the present invention contain repeating unit represented by the following Formula 1.

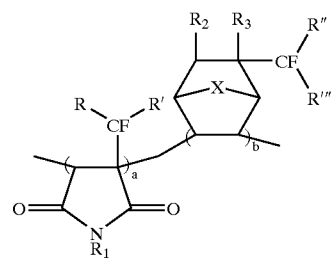

Formula 1 wherein, $R_1$ and $R_2$ individually represent H, $(C_1-C_{10})$ alkyl or $(C_1-C_{10})$ alkyl comprising ether group(—O—); $R_3$ is $(C_1-C_{20})$ alkyl, perfluoroalkyl, partially fluorine-substituted alkyl carboxylate or $COOR°$; $R°$ is an acid labile protecting group; R, R', R" and R'" individually represent H, F, $(C_1-C_{10})$ perfluoroalkyl, $(C_1-C_{10})$ perfluoroalkyl containing ether group(—O—), partially fluorine-substituted $(C_1-C_{10})$ alkyl or partially fluorine-substituted $(C_1-C_{10})$ alkyl containing ether group(—O—); X is $CH_2$, $CH_2CH_2$, S or O; and the ratio a:b is 10~90 mol % :90~10 mol %.

The acid labile protecting group is the one that can be released by acid, which prevent the compound from dissolving in an alkaline developing solution. Some of conventional acid labile protecting group is bounded to polymer, the dissolution of photoresist material by alkaline developing solution is inhibited, while, in case that the acid labile protecting group is released by acid generated by light exposure, the photoresist material can be dissolved in developing solution. As the acid labile protecting group, any groups that can serve such a role may be used; the groups include what are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000) and U.S. Pat. No. 6,132,926 (Oct. 17, 2000). Preferred acid labile protecting groups are selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl and 2-acetylmenth-1-yl.

Preferable example of the repeating unit represented by Formula 1 is selected from the group consisting of the following Formulas 1a to Formula 1d;

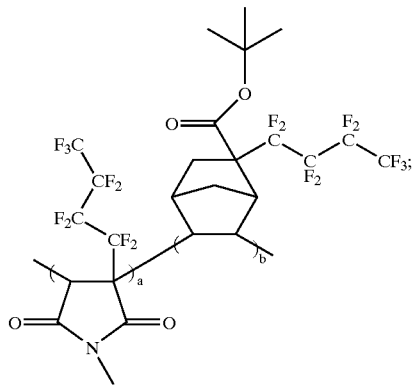

Formula 1a

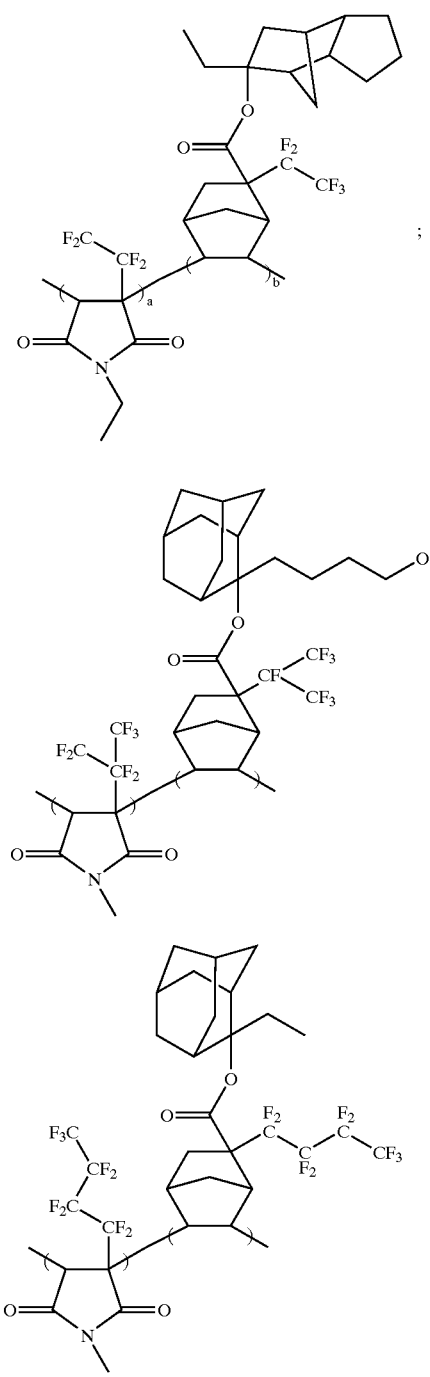

The repeating units of Formula 1, which are fluorine-substituted maleimide-norbornene system, have excellent etching resistance and development ability when coated with about 200 nm thickness as well as below 100 nm thickness, because it have high transmittance at 157 nm wavelength.

Figure 1:
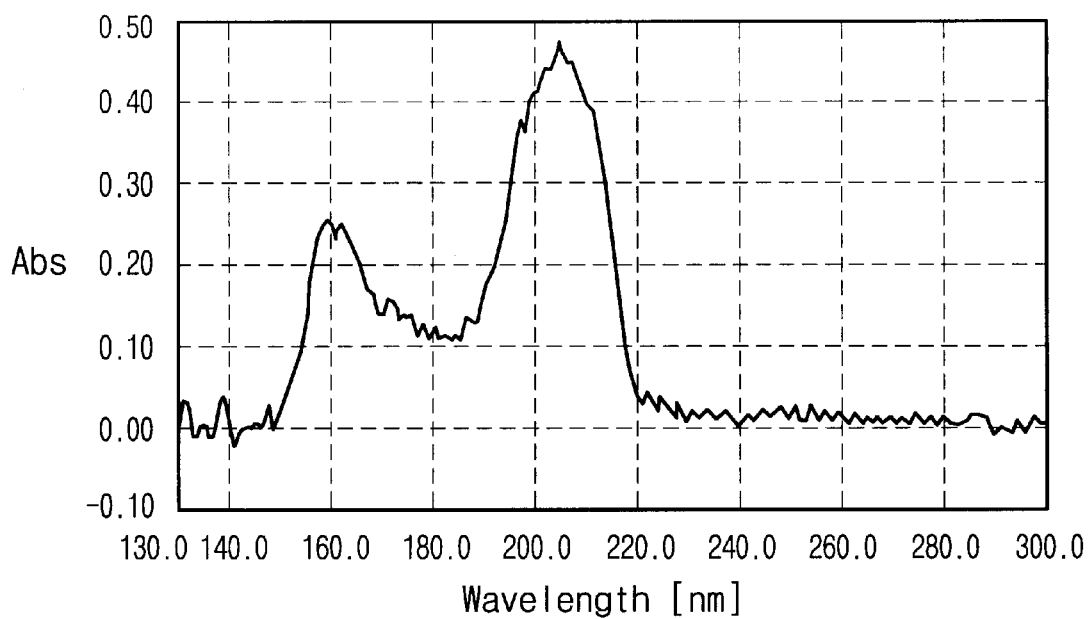
FIG. 1 is a VUV spectrum for compound of Formula 1.

The spectrum of FIG. 1 is the absorbency of polymer of Formula 1a, when coated with 250 nm thickness. The absorbency of the polymer is 0.23 at 157 nm wavelengths, which is about one-half of the absorbency of the general photoresist.

The former photoresists can been patterned at 157 nm wavelength, when coated with a thickness below about 70 nm thickness. But the photoresist compositions containing repeating unit of Formula 1a can be patterned when coated with a thickness over 120 nm.

In addition, the polymer can be prepared by a process comprising:
(a) admixing (i) a compound of Formula 2 and (ii) a compound of Formula 3 to obtain a mixture;
(b) adding a polymerization initiator into the mixture to obtain the following Formula 4; and
(c) reacting Formula 4 and the following Formula 5 under a base catalyst to obtain a repeating unit of as described above Formula 1,

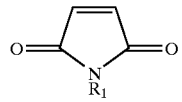

Formula 2

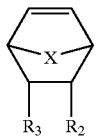

Formula 3

Formula 4

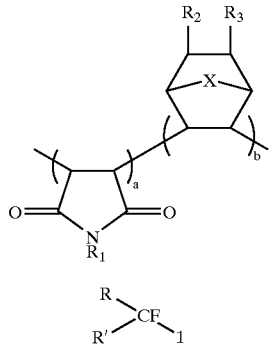

Formula 5 wherein, $R_1$, $R_2$, $R_3$, R, R', X, a and b are defined as described above Formula 1. Moreover, R is same as R' and R" is same as R''' in Formula 1 when the above preparing process is performed.

In addition, The compound of Formula 5 is perfluorobutyl iodide, perfluoroethyl iodide or perfluoroisopropyl iodide.

The polymerization may be performed by bulk polymerization or solution polymerization.

When solution polymerization is performed, the step (a) is preferably carried out in conventional organic solvent, for example, tetrahydrofuran, cyclohexanone, cyclopentanone, dimethylformamide, dimethylsulfoxide, methyl ethyl ketone, dioxane, benzene, toluene, xylene, and mixtures thereof.

The polymerization initiators of the step (b) can be any conventional one, for example, 2,2'-azobisisobutyronitrile (AIBN), benzoylperoxide, acetylperoxide, laurylperoxide, tert-butylperacetate, tert-butylhydroperoxide or di-tert-butylperoxide.

In addition, the base catalyst of the step (c) uses NaH, $CaH_2$ or n-BuLi.

The polymerization is reacted at a temperature ranging from about −10° C. to about 10° C. for time ranging from about 10 to about 12 hours.

Thereafter, the polymer of Formula 1 is precipitated to obtain by using the solvent of diethyl ether/petroleum ether, n-hexane, methanol/water or mixtures thereof.

In addition, a photoresist composition containing (i) a photoresist polymer described above; (ii) a photoacid generator; and (iii) an organic solvent.

Any of photoacid generators, which are able to generate acid by light, can be used in photoresist composition of present invention. Conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000) and U.S. Pat. No. 6,132,926 (Oct. 17, 2000).

Preferred photoacid generators have relatively low absorbance at 157 nm and 193 nm wavelengths. More preferred photoacid generator include sulfide or onium type compounds. Specifically, photoacid generators are selected from the group consisting of phthalimido trifluoromethanesulfonate, dinitrobenzyl tosylate, n-decyldisulfone and naphthylimido trifluoromethanesulfonate.

The photoacid generator can further comprise a compound selected from the group consisting of diphenyliodide hexafluorophosphate, diphenyliodide hexafluoroarsenate, diphenyliodide hexafluoroantimonate, diphenyl-p-methoxyphenyl triflate, diphenyl-p-toluenyl triflate, diphenyl-p-isobutylphenyl triflate, triphenylsulfonium hexafluoroarsenate, triphenylsulfonium hexafluoroantimonate, triphenylsulfonium triflate, dibutyl-naphthylsulfonium triflate and mixtures thereof.

The photoacid generator is preferably used in an amount ranging from about 0.05 to about 10 wt % of the photoresist polymer. If has been found that when the photoacid generator is used in the amount less than about 0.05 wt %, it lowers photosensitivity of the photoresist composition, and when the photoacid generator is used in the amount of grater than about 10 wt %, it result in poor pattern formation and due to its high absorption of DUV.

The organic solvent can be any of known solvent disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000) and U.S. Pat. No. 6,132,926 (Oct. 17, 2000).

Preferable organic solvents include methyl 3-methoxy propionate, ethyl 3-ethoxypropionate, propyleneglycol methyl ether acetate, cyclohexanone, 2-heptanone, ethyl lactate, diethylene glycol diethyl ether or mixture thereof.

The amount of organic solvent ranges from about 500 to 2000 wt % of the photoresist polymer to coat the photoresist in a wanted thickness. It has been found that when the amount of organic solvent is about 1000 wt % of the photoresist polymer, a photoresist layer having about 0.25 μm of thickness can be obtained.

In addition, the present invention provides a process for forming a photoresist pattern comprises:

(a) coating the photoresist composition described above on a substrate to form a photoresist film;

(b) exposing the photoresist film to light; and (c) developing the photoresist film to form a photoresist pattern.

The process for forming the photoresist pattern can further include a soft baking step, which is performed before the step (b), and/or a post baking step which is performed after the step (b). Preferably, the soft and post baking steps are performed at the temperature ranging from about 70 to about 200° C.

Exemplary light sources which are useful for forming the photoresist pattern include ArF, KrF, VUV, EUV, E-beam, X-ray or ion beam. Preferably, the irradiation energy in step (b) is ranging from about 1 mJ/cm$^2$ to about 100 mJ/cm$^2$.

The photoresist compositions of the present invention are more suitable for VUV light source.

In addition, the present invention also provides a semiconductor device manufactured using the photoresist compositions.

I. Preparation of Photoresist Polymers

EXAMPLE 1

Synthesis of Compound of Formula 1a
(Step 1) Synthesis of Poly(N-methyl Maleimide/Tert-butyl-5-norbornene-2-carboxylate)

To 25 mL of tetrahydrofuran was added 100 mmole of N-methyl maleimide, 100 mmole of tert-butyl-5-norbornene-2-carboxylate and 0.5 of AIBN, and the resulting solution was reacted at about 65° C. for about 6 hours.

Thereafter, polymer was precipitated in diethyl ether or diethyl ether/petroleum ether solution, filtered and dried in vacuo to obtain title compound (yield :35%).

(Step 2) Synthesis of Formula 1a

To 9 g of anhydrous tetrahydrofuran was added 9.1 g of a polymer obtained in step 1 and 8 g of 95% dry NaH and the resulting solution was reacted at about 0° C. for about 30 min. Adding 21 g of perfluorobutyl iodide into the resultant, and the resulting solution was reacted at room temperature for about 12 hours.

Thereafter, polymer and NaI was precipitated in diethyl ether/petroleum ether solution, filtered and dried in vacuo and washed water to obtain perfluorobutyl-substituted title compound.

EXAMPLE 2

Synthesis of Compound of Formula 1b
(Step 1) Synthesis of Poly(N-ethyl Maleimide/8-ethyl-8-tricyclodecyl-5-norbornene-2-carboxylate)

To 25 mL of tetrahydrofuran was added 100 mmole of N-ethyl maleimide, 100 mmole of 8-ethyl-8-tricyclodecyl-5-norbornene-2-carboxylate and 0.30 g of AIBN, and the resulting solution was reacted at about 65° C. for about 6 hours.

Thereafter, polymer was precipitated in diethyl ether or diethyl ether/petroleum ether solution, filtered and dried in vacuo to obtain title compound (yield :36%).

(Step 2) Synthesis of Formula 1b

To 9 g of anhydrous tetrahydrofuran was added 9.1 g of a polymer obtained in step 1 and 8 g of 95% dry NaH and the resulting solution was reacted at about 0° C. for about 30 min. Adding 15 g of perfluoroethyl iodide into the resultant, and the resulting solution was reacted at room temperature for about 12 hours.

Thereafter, polymer and NaI was precipitated in diethyl ether/petroleum ether solution, filtered and dried in vacuo and washed water to obtain perfluoroethyl-substituted title compound.

EXAMPLE 3

Synthesis of Compound of Formula 1c
(Step 1) Synthesis of Poly(N-methyl Maleimide/2-methoxybutyl-2-adamanthyl-5-norbornene-2-carboxylate)

To 25 mL of tetrahydrofuran was added 100 mmole of N-methyl maleimide, 100 mmole of 2-methoxybutyl-2-adamantyl-5-norbornene-2-carboxylate and 1.3 g of AIBN, and the resulting solution was reacted at about 65° C. for about 6 hours.

Thereafter, polymer was precipitated in diethyl ether or diethyl ether/petroleum ether solution, filtered and dried in vacuo to obtain title compound (yield :33%).

(Step 2) Synthesis of Formula 1c

To 9 g of anhydrous tetrahydrofuran was added 9.1 g of a polymer obtained in step 1 and 8 g of 95% dry NaH and the resulting solution was reacted at about 0° C. for about 30 min. Adding 18 g of perfluoroisopropyl iodide into the resultant, and the resulting solution was reacted at room temperature for 12 hours.

Thereafter, polymer and NaI was precipitated in diethyl ether/petroleum ether solution, filtered and dried in vacuo and washed water to obtain perfluoroisopropyl-substituted title compound.

EXAMPLE 4

Synthesis of Compound of Formula 1d
(Step 1) Synthesis of Poly(N-methyl Maleimide/2-ethyl-2-adamanthyl-5-norbornene-2-carboxylate)

To 25 mL of tetrahydrofuran was added 100 mmole of N-methyl maleimide, 100 mmole of 2-ethyl-adamanthyl-5-norbornene-2-carboxylate and 0.3 g of AIBN, and the resulting solution was reacted at about 65° C. for about 6 hours.

Thereafter, polymer was precipitated in diethyl ether or diethyl ether/petroleum ether solution, filtered and dried in vacuo to obtain title compound (yield :34%).
(Step 2) Synthesis of Formula 1d To 9 g of anhydrous tetrahydrofuran was added 9.1 g of a polymer obtained of step 1 and 8 g of 95% dry NaH and the resulting solution was reacted at about 0° C. for about 30 min. Adding 21 g of perfluorobutyl iodide into the resultant, and the resulting solution was reacted at room temperature for about 12 hours.

Thereafter, polymer and NaI was precipitated in diethyl ether/petroleum ether solution, filtered and dried in vacuo and washed water to obtain perfluorobutyl-substituted title compound.

II. Preparation of Photoresist Composition and Formation of Patterns

EXAMPLE 5

To 100 g of propylene glycol methyl ether acetate (PGMEA) was added 10 g of the polymer obtained in Example 1, 0.06 g of phthalimidotrifluoromethane sulfonate, and 0.06 g of triphenylsulfonium triflate. The resulting solution was filtered through 0.20 µm filter to obtain a photoresist composition.

Figure 2:
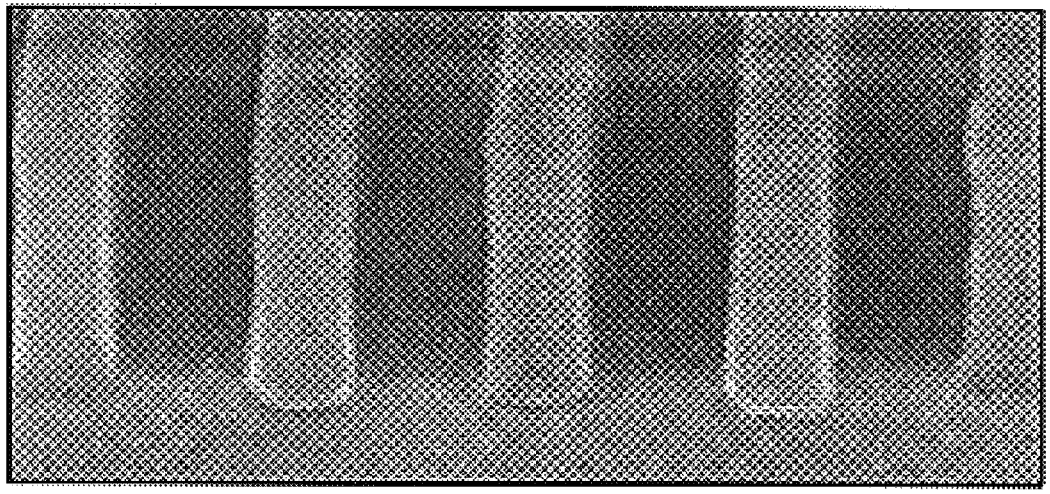
FIG. 2 is a photograph showing a pattern obtained in Example 5.

The photoresist composition thus prepared was spin-coated on silicon wafer to form a photoresist film, and soft-baked in an oven or hot plate of about 110° C. for about 90 seconds. After baking, the photoresist was exposed to light using a KrF laser exposer, and then post-baked at about 110° C. for about 90 seconds. When the post-baking was completed, it was developed in 2.38 wt % aqueous TMAH solution for about 40 seconds, to obtain 0.14 µm L/S pattern (see FIG. 2).

EXAMPLE 6

To 100 g of propylene glycol methyl ether acetate (PGMEA) was added 10 g of the polymer obtained in Example 2, 0.06 g of phthalimidotrifluoromethane sulfonate, and 0.06 g of triphenylsulfonium triflate. The resulting solution was filtered through 0.20 µm filter to obtain a photoresist composition.

Figure 3:
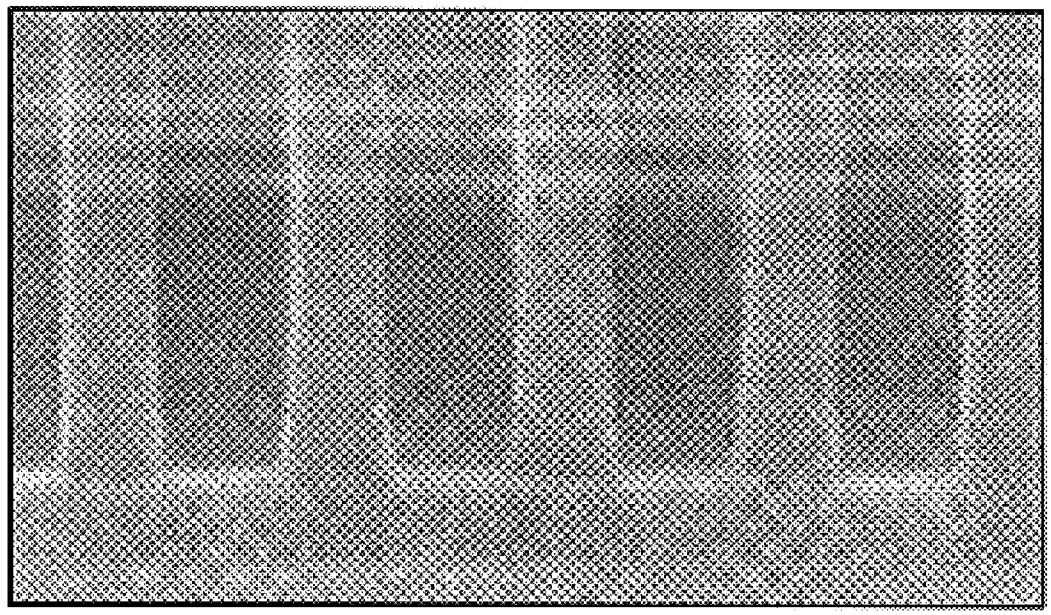
FIG. 3 is a photograph showing a pattern obtained in Example 6.

The photoresist composition thus prepared was spin-coated on silicon wafer to form a photoresist film, and soft-baked in an oven or hot plate of about 110° C. for about 90 seconds. After baking, the photoresist was exposed to light using a KrF laser exposer, and then post-baked at about 110° C. for about 90 seconds. When the post-baking was completed, it was developed in 2.38 wt % aqueous TMAH solution for about 40 seconds, to obtain 0.14 µm L/S pattern (see FIG. 3).

EXAMPLE 7

To 100 g of propylene glycol methyl ether acetate (PGMEA) was added log of the polymer obtained in Example 3, 0.06 g of phthalimidotrifluoromethane sulfonate, and 0.06 g of triphenylsulfonium triflate. The resulting solution was filtered through 0.20 µm filter to obtain a photoresist composition.

Figure 4:
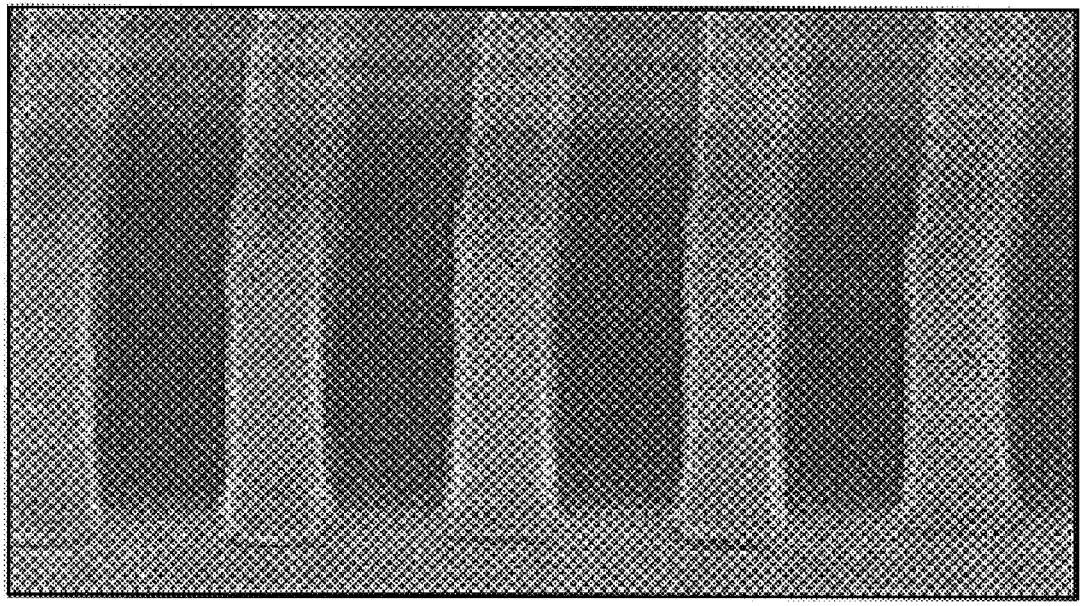
FIG. 4 is a photograph showing a pattern obtained in Example 7.

The photoresist composition thus prepared was spin-coated on silicon wafer to form a photoresist film, and soft-baked in an oven or hot plate of about 110° C. for about 90 seconds. After baking, the photoresist was exposed to light using a KrF laser exposer, and then post-baked at about 110° C. for about 90 seconds. When the post-baking was completed, it was developed in 2.38 wt % aqueous TMAH solution for about 40 seconds, to obtain 0.14 µm L/S pattern (see FIG. 4).

EXAMPLE 8

To 100 g of propylene glycol methyl ether acetate (PGMEA) was added 10 g of the polymer obtained in Example 4, 0.06 g of phthalimidotrifluoromethane sulfonate, and 0.06 g of triphenylsulfonium triflate. The resulting solution was filtered through 0.20 µm filter to obtain a photoresist composition.

Figure 5:
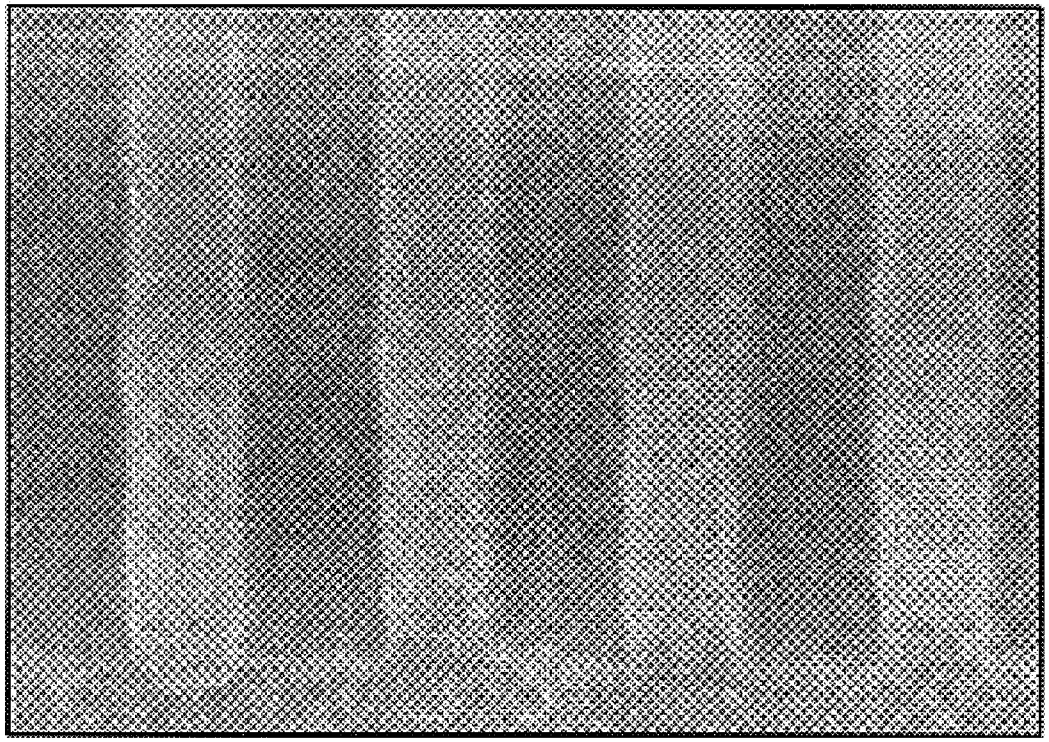
FIG. 5 is a photograph showing a pattern obtained in Example 8.

The photoresist composition thus prepared was spin-coated on silicon wafer to form a photoresist film, and soft-baked in an oven or hot plate of about 110° C. for about 90 seconds. After baking, the photoresist was exposed to light using a KrF laser exposer, and then post-baked at about 110° C. for about 90 seconds. When the post-baking was completed, it was developed in 2.38 wt % aqueous TMAH solution for about 40 seconds, to obtain 0.13 µm L/S pattern (see FIG. 5).

EXAMPLE 9

The photoresist composition obtained in Example 5 was coated on $CaF_2$ wafer with a 2000 Å thickness and the absorbency of the photoresist was composition measured by VUV spectrum.

As discussed earlier, the photoresist pattern using the compositions of the present invention can be formed with excellent durability, etching resistance, employing and resolution. In addition, the photoresist compositions can be used to form an ultrafine pattern of DRAM over 4 G and 16 G as well as DRAM below 1 G. Moreover, the photoresist polymer comprising fluorine has high light transmittance at a low wavelength of light source, and thus is suitable for ArF, KrF, VUV, EUV and E-beam.

What is claimed:

1. A photoresist polymer comprising a repeating unit selected from the group consisting of Formula 1a through Formula 1d:

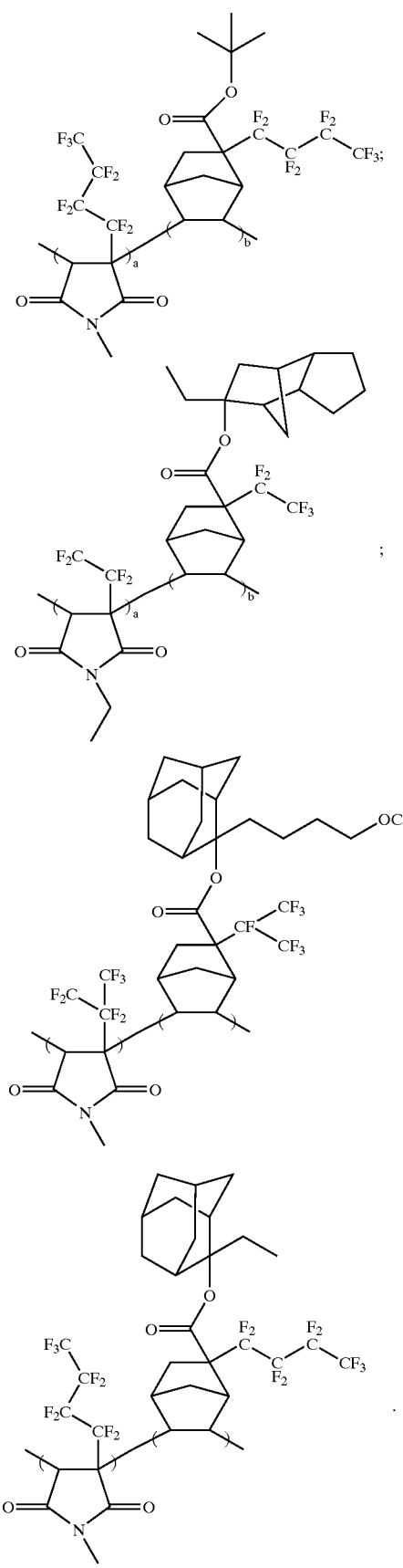

Formula 1a

Formula 1b

Formula 1c

; and

Formula 1d

2. A process for preparing a photoresist polymer comprising:
(a) admixing (i) a compound of Formula 2 and (ii) a compound of Formula 3 to obtain a mixture;
(b) adding a polymerization initiator to the mixture to obtain the following Formula 4; and
(c) reacting Formula 4 and following Formula 5 with a base catalyst to obtain a repeating unit of the following Formula 1,

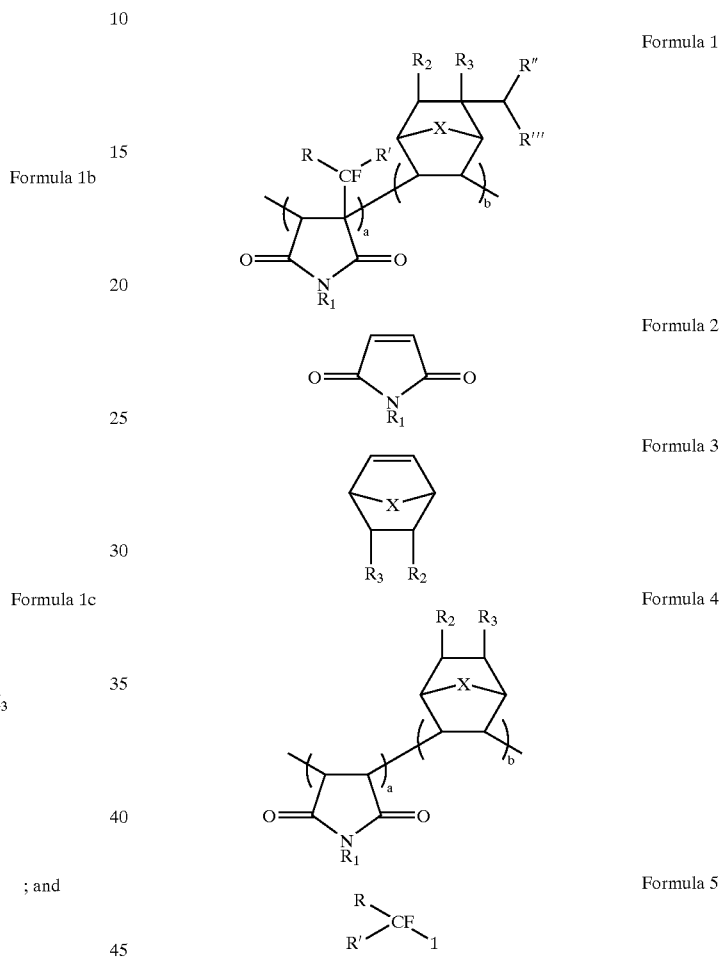

wherein, $R_1$ and $R_2$ are individually selected from the group consisting of H, ($C_1$–$C_{10}$) alkyl and ($C_1$–$C_{10}$) alkyl comprising ether group(—O—); $R_3$ is selected from the group consisting of ($C_1$–$C_{20}$) alkyl, perfluoroalkyl, partially fluorine-substituted alkyl carboxylate and COOR°; R° is an acid labile protecting group; R, R', R" and R'" are individually selected from the group consisting of H, F, ($C_1$–$C_{10}$) perfluoroalkyl, ($C_1$–$C_{10}$) perfluoroalkyl containing ether group(—O—), partially fluorine-substituted ($C_1$–$C_{10}$) alkyl and partially fluorine-substituted ($C_1$–$C_{10}$) alkyl containing ether group(—O—); X is selected from the group consisting of $CH_2$, $CH_2CH_2$, S and O; and the ratio a:b falls within the ranges 10~90 mol %:90~10 mol %.

3. The process for preparing a photoresist polymer according to claim 2, wherein the step (a) is carried out in a polymerization solvent is selected from the group consisting of tetrahydrofuran, cyclohexanone, cyclopentanone, dimethylformamide, dimethylsulfoxide, methyl ethyl ketone, dioxane, benzene, toluene, xylene, and mixtures thereof.

4. The process for preparing a photoresist polymer according to claim 2, wherein the polymerization initiator is selected from the group consisting of 2,2'-azobisisobutyronitrile(AIBN), benzoylperoxide, acetylperoxide, laurylperoxide, tert-butylacetate, tert-butylhydroperoxide and di-tert-butylperoxide.

5. The process for preparing a photoresist polymer according to claim 2, wherein the compound of Formula 3 is selected from the group consisting of tert-butyl-5-norbornene-2-carboxylate, 8-ethyl-8-tricyclodecyl-5-norbornene-2-carboxylate, 2-methoxybutyl-2-adamanthyl-5-norbornene-2-carboxylate and 2-ethyl-2-adamanthyl-5-norbornene-2-carboxylate.

6. The process for preparing a photoresist polymer according to claim 2, wherein the compound of Formula 5 is selected from the group consisting of perfluorobutyl iodide, perfluoroethyl iodide and perfluoroisopropyl iodide.

7. A photoresist composition comprising:
(i) the photoresist polymer of claim 1;
(ii) an organic solvent; and
(iii) a photoacid generator.

8. The photoresist composition according to claim 7, wherein the photoacid generator comprises a material selected from the group consisting of phthalimidotrifluoromethane sulfonate, dinitrobenzyl tosylate, n-decyl disulfone and naphthyl imidotrifluoro methanesulfonate.

9. The photoresist composition according to claim 8, wherein the photoacid generator further comprises at least one compound selected from the group consisting of diphenyl iodide hexafluorophosphate, diphenyliodide hexafluoroarsenate, diphenyliodide hexafluoroantimonate, diphenyl-p-methoxyphenylsulfonim triflate, diphenyl-p-toluenylsulfonium triflate, diphenyl-p-isobutylphenylsulfonium triflate, triphenylsulfonium hexafluoroarsenate, triphenylsulfonium hexafluoroantimonate, triphenylsulfonium triflate and dibutylnaphthylsulfonium triflate.

10. The photoresist composition according to claim 7, wherein the photoacid generator is used in an amount ranging from about 0.05 to about 10% by weight of the photoresist polymer.

11. The photoresist composition according to claim 7, wherein the organic solvent is selected from the group consisting of methyl 3-methoxypropionate, ethyl 3-ethoxypropionate, propyleneglycol methyl ether acetate, cyclohexanone, 2-heptanone, ethyl lactate, diethylene glycol diethyl ether and mixtures thereof.

12. The photoresist composition according to claim 7, wherein the organic solvent is used in an amount ranging from about 500 to about 2000% by weight of said photoresist polymer.

13. A process for formation of a photoresist pattern comprising:
(a) coating the photoresist composition of claim 7 on a substrate to form a photoresist film;
(b) exposing the photoresist film to light; and
(c) developing the photoresist film to form a photoresist pattern.

14. The process according to claim 13, further comprising a soft baking step before step (b) and/or a post baking step after step (b).

15. The process according to claim 14, wherein the soft and post baking steps are individually performed at the temperature ranging from about 70 to about 200° C.

16. The process according to claim 13, wherein the source of light is selected from the group consisting of KrF, ArF, VUV, EUV, E-beam, x-ray and ion beam.

17. The process according to claim 13, wherein the irradiation energy in step (b) is in the range from about 1 mJ/cm$^2$ to about 100 mJ/cm$^2$.

18. A semiconductor element manufactured according to the process of claim 13.

* * * * *

UNITED STATES PATENT AND TRADEMARK OFFICE
CERTIFICATE OF CORRECTION

PATENT NO. : 6,720,129 B2  
DATED : April 13, 2004  
INVENTOR(S) : Geun-Su Lee et al.

It is certified that error appears in the above-identified patent and that said Letters Patent is hereby corrected as shown below:

Title page,  
Item [75], Inventors, please delete "Ichon-shi" and replace with -- Kyoungki-do --.

Column 2,  
Lines 1-12, Formula 1, please delete this entire formula and replace it with the following formula:

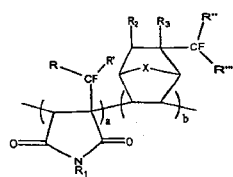

Formula 1

Column 3,  
Lines 2-17, Formula 1b, please delete this entire formula and replace it with the following formula:

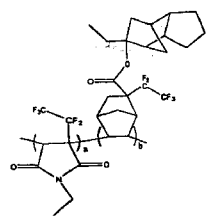

Formula 1b

Lines 19-37, Formula 1c, please delete this entire formula and replace it with the following formula:

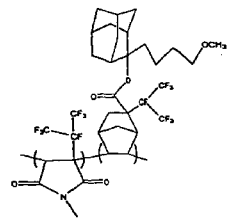

Formula 1c

; and

UNITED STATES PATENT AND TRADEMARK OFFICE
CERTIFICATE OF CORRECTION

PATENT NO. : 6,720,129 B2
DATED : April 13, 2004
INVENTOR(S) : Geun-Su Lee et al.

It is certified that error appears in the above-identified patent and that said Letters Patent is hereby corrected as shown below:

Column 9,
Lines 16-31, Formula 1b, please delete this entire formula and replace it with the following formula:

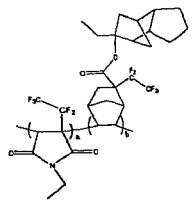

Formula 1b

Lines 32-49, Formula 1c, please delete this formula and replace it with the following formula:

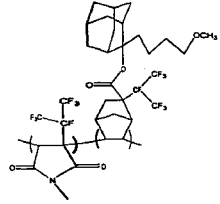

Formula 1c

UNITED STATES PATENT AND TRADEMARK OFFICE
CERTIFICATE OF CORRECTION

PATENT NO. : 6,720,129 B2
DATED : April 13, 2004
INVENTOR(S) : Geun-Su Lee et al.

It is certified that error appears in the above-identified patent and that said Letters Patent is hereby corrected as shown below:

Column 10,
Lines 12-22, Formula 1, please delete this entire formula and replace it with the following formula:

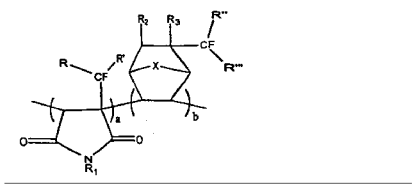

Formula 1

Signed and Sealed this

Twenty-fourth Day of August, 2004

JON W. DUDAS
*Director of the United States Patent and Trademark Office*